(12) United States Patent
Wisotzki et al.

(10) Patent No.: US 9,590,033 B1
(45) Date of Patent: Mar. 7, 2017

(54) TRENCH SEPARATION DIFFUSION FOR HIGH VOLTAGE DEVICE

(71) Applicant: IXYS Corporation, Milpitas, CA (US)

(72) Inventors: Elmar Wisotzki, Darmstadt (DE); Christoph Koerber, Ober-Ramstadt (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/948,156

(22) Filed: Nov. 20, 2015

(51) Int. Cl.
*H01L 29/76* (2006.01)
*H01L 29/06* (2006.01)
*H01L 29/74* (2006.01)
*H01L 21/761* (2006.01)
*H01L 29/08* (2006.01)

(52) U.S. Cl.
CPC ........ *H01L 29/0646* (2013.01); *H01L 21/761* (2013.01); *H01L 29/74* (2013.01); *H01L 29/0834* (2013.01); *H01L 2924/1301* (2013.01)

(58) Field of Classification Search
None
See application file for complete search history.

(56) References Cited

U.S. PATENT DOCUMENTS

| | | | |
|---|---|---|---|
| 4,040,878 A | 8/1977 | Rowe | 148/188 |
| 4,351,677 A | 9/1982 | Mochizuki et al. | 148/188 |
| 4,904,609 A * | 2/1990 | Temple | H01L 21/78 148/DIG. 126 |
| 5,698,454 A | 12/1997 | Zommer | 437/6 |
| 6,507,050 B1 * | 1/2003 | Green | H01L 29/0619 257/127 |
| 6,936,908 B2 | 8/2005 | Kelberlau et al. | 257/502 |
| 7,030,426 B2 | 4/2006 | Neidig | 257/170 |
| 7,442,630 B2 | 10/2008 | Kelberlau et al. | 438/510 |
| 7,776,672 B2 | 8/2010 | Nakazawa et al. | 438/197 |
| 8,093,652 B2 | 1/2012 | Bose Jayappa Veeramma et al. | 257/329 |

* cited by examiner

*Primary Examiner* — Ermias Woldegeorgis
(74) *Attorney, Agent, or Firm* — Imperium Patent Works; T. Lester Wallace

(57) ABSTRACT

A manufacturable and economically viable edge termination structure allows a semiconductor device to withstand a very high reverse blocking voltage (for example, 8500 volts) without suffering breakdown. A P type peripheral aluminum diffusion region extends around the bottom periphery of a thick die. The peripheral aluminum diffusion region extends upward from the bottom surface of the die, extending into N– type bulk silicon. A deep peripheral trench extends around the upper periphery of the die. The deep trench extends from the topside of the die down toward the peripheral aluminum diffusion region. A P type sidewall doped region extends laterally inward from the inner sidewall of the trench, and extends laterally outward from the outer sidewall of the trench. The P type sidewall doped region joins with the P type peripheral aluminum diffusion region, thereby forming a separation edge diffusion structure that surrounds the active area of the die.

20 Claims, 8 Drawing Sheets

HIGH REVERSE VOLTAGE THYRISTOR
(8500 VOLTS REVERSE BLOCKING VOLTAGE)

DEPOSIT AND PATTERN ALUMINUM

BOTTOM OF WAFER

CONVERT ALUMINUM INTO ALUMINUM OXIDE

HIGH TEMP DRIVE IN
(DIFFUSE ALUMINUM DEEP INTO WAFER)

REMOVE ALUMINUM OXIDE

REMOVE SILICON OXIDE

BACKSIDE BORON

TRENCH FROM TOP SURFACE

TOP OF WAFER

SIDEWALL DOPE WITH BORON, DRIVE IN

FILL TRENCHES WITH POLYSILICON AND PLANARIZE TOP

ADD TOPSIDE STRUCTURES, TOPSIDE AND BOTTOMSIDE METALIZATION

SAW CUT AT SCRIBE LINE

TRENCH SEPARATION DIFFUSION FOR HIGH VOLTAGE DEVICE

TECHNICAL FIELD

The described embodiments relate to edge termination and separation structures for power semiconductor devices.

BACKGROUND INFORMATION

Some power semiconductor devices, such as reverse blocking IGBTs, high voltage inverse diodes, and high reverse blocking voltage thyristors, must be able to withstand high reverse voltages without suffering breakdown. Under high reverse voltages, a depletion region extends outward from a reverse biased junction in the active area of the device. If this depletion region, with its attendant high electric fields, were allowed to reach the side edges of the die, then breakdown and leakage may occur at the side edges of the die. For such high voltage bidirectional devices that are to withstand reverse voltages up to 3000 volts, a separation edge diffusion technology has been used. At the time of initial wafer processing, a first strip of aluminum is provided on the top of the N− type wafer so that the strip extends along what will be the ultimate edges of the device die. A second strip of aluminum is provided on the opposite side of the wafer, directly underneath the first strip. The two aluminum strips act as a diffusion sources. Under high temperature conditions, aluminum from these strips is made to diffuse into the wafer, thereby forming a downward extending P type region that extends downward from the top of the wafer, and thereby forming an upward extending P type region that extends upward from the bottom of the wafer. The two diffusion fronts of aluminum meet, thereby forming a single P type separation diffusion region that extends all the way from the top of the wafer, through the wafer, and to the bottom of the wafer. This separation diffusion region separates the active area of the device from what will be the die edge after singulation. The separation edge diffusion keeps the high electric fields of the reverse biased depletion region in the active area from reaching the sidewall edges of the die. For additional information on separation edge diffusion structures and techniques, see: 1) U.S. Pat. No. 7,442,630, entitled "Method For Fabricating Forward And Reverse Blocking Devices, filed Aug. 30, 2005, by Kelberlau et al.; 2) U.S. Pat. No. 5,698,454, entitled "Method Of Making A Reverse Blocking IGBT", filed Jul. 31, 1995, by N. Zommer; and 3) J. Lutz et al., "Semiconductor Power Devices", pages 146-147, published by Springer, Berlin and Heidelberg (2011).

For a bidirectional blocking device that is to withstand 3000 volts of reverse voltage, the wafer must be about 300 to 400 microns thick in order to provide enough silicon to contain the wide depletion region. The diffusion time required to form a separation edge diffusion through this wafer thickness is about 100 hours. If the separation edge diffusion technology is to be applied for blocking voltages over 3000 volts, then thicker silicon wafers are required. A rule of thumb is that about 100 microns more silicon in wafer thickness is required for each additional 1000 volts of blocking voltage. Diffusion depth, however, increases with the square root of diffusion time. So where the separation diffusion technique can be used to form separation diffusions through a 300 micron thick wafer in about 100 hours of diffusion time, doubling the wafer thickness to 600 microns would require a diffusion time equal to the square of the 100 hour diffusion time for the 300 micron thick wafer. The square of 100 hours of diffusion time is 10,000 hours. In addition, dopants of a very deep separation diffusion structure would diffuse laterally as well as vertically. The resulting large lateral extent of the separation diffusion structure would serve to consume an undesirably large amount of semiconductor die area. Accordingly, the extremely large amount of diffusion time and the undesirable large lateral dimension of the separation diffusion structure makes using the separation diffusion region technique commercially impractical for devices that are to have reverse blocking voltage ratings much in excess of 3000 volts.

Perhaps as a consequence of the impracticality of the separation edge diffusion technique mentioned above, the state of the art in the making of very high reverse voltage devices involves what are called bevel edge terminations. In bevel edge termination techniques, semiconductor material is removed at the upper peripheral edge of the die, thereby forming a so-called "bevel" at the upper peripheral edge of the die. In some technologies, this bevel edge is formed by mechanical grinding. In other techniques, the bevel edge is formed using etching techniques. For additional explanation of bevel edge termination techniques, see: B. Jayant Baliga, "Power Semiconductor Devices", Chapter 3, pages 66-128, published by PWS Publishing Company, 20 Park Plaza, Boston, Mass. (1996). In one technique, a bevel edge is formed by etching a wide trench at what will be the die edge, where the sidewalls of the wide trench are sloped. For additional information, see: 1) U.S. Pat. No. 7,741,192, entitled "Semiconductor Device And manufacturing Method Thereof", filed Aug. 19, 2005, by Shimoyama et al.; and 2) U.S. Pat. No. 7,776,672, entitled "Semiconductor Device And manufacturing Method Thereof", filed Mar. 27, 2006, by Nakazawa et al. After the trench with the sloped sidewalls is formed, the wafer is singulated into dice by cutting, either using a saw or by laser cutting, down the center of the bottom of the trench. The sloped sidewall on one side of the trench forms the bevel edge of one die. The sloped sidewall on the opposite side of the trench forms the bevel edge of another die. In other bevel techniques, the semiconductor device is much larger and may, for example, when considered from the top-down perspective, be circular in shape. After the large area device die has been cut from the wafer, grinding and polishing processes are employed on the singulated circular dice in order to bevel the upper peripheral circular edges of the circular device. There are numerous other bevel edge termination techniques known in the art. Near ideal breakdown voltages are achievable using bevel edge termination techniques.

SUMMARY

A manufacturable and economically viable edge termination structure allows a semiconductor device to withstand a very high reverse blocking voltage well in excess of 3000 volts (for example, 8500 volts) without suffering breakdown. A P type peripheral aluminum diffusion region extends around the bottom peripheral edges of a thick die. The thick die has a rectangular top surface and a rectangular bottom surface. The die is adequately thick to retain the depletion region present when the device is under the very high reverse blocking voltage. In one example, the die is 850 microns thick. The P type dopant is aluminum. In the vertical dimension, the P type peripheral aluminum diffusion region extends upward from the bottom semiconductor surface of the die, extending into N− type bulk silicon. The P type peripheral aluminum diffusion region extends less than half way through the wafer, and in an advantageous aspect is formed in less than 200 hours of diffusion time.

A deep peripheral trench extends around the upper peripheral edges of the die. The deep trench extends, in the vertical dimension, from the topside surface of the die down toward the P type peripheral aluminum diffusion region. P type dopants are diffused into the sidewalls of the deep trench, so that a P type sidewall doped region extends laterally inward from the inner sidewall of the trench, and so that the P type sidewall doped region also extends laterally outward from the outer sidewall of the trench. The peripheral trench is filled later with a solid trench fill material. The solid trench fill material may, for example, P type polysilicon or silicon oxide. Although the peripheral trench is disposed relatively close to the die sidewalls, an amount of N type semiconductor material laterally rings the trench such that N type bulk wafer material is disposed between the peripheral trench and the peripheral side edges of the die.

P type semiconductor material of the P type sidewall doped region joins with P type semiconductor material of the peripheral aluminum diffusion region, thereby forming a single P type separation edge diffusion structure. The single P type separation edge diffusion structure, in the vertical dimension, extends all the way from the top semiconductor surface of the die to the bottom semiconductor surface of the die. In the lateral dimension, the P type separation edge diffusion structure surrounds the active area of the die, and separates the active area at the center of the die from the four side edges of the die. Advantageously, the die has no bevel edge termination feature. The complexities and expense of forming a beveled edge on a rectangular singulated die are avoided. In one example, a high reverse voltage thyristor is disposed in the active area of the die, so that the novel P type separation edge diffusion structure separates the high reverse voltage thyristor from the four side edges of the die. In another example, another semiconductor device (for example, a reverse blocking IGBT or an inverse diode) that is to withstand the very high reverse blocking voltage is disposed in the active area, so that the novel P type separation edge diffusion structure separates that device from the edges of the die.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "upward", "down", "downward", "vertically", "horizontally", "laterally", "lower", "under", "below", "beneath" and "bottom" are used herein to describe relative orientations between different parts of the structure being described, and it is to be understood that the overall structure being described can actually be oriented in any way in three-dimensional space. When processing is described in the description below as being performed on the bottom of the wafer, such as for example when dopants are said to diffuse upward, it is understood the wafer may actually be oriented upside down during these processing steps, and may be processed from the top in ordinary fashion.

Figure 1:
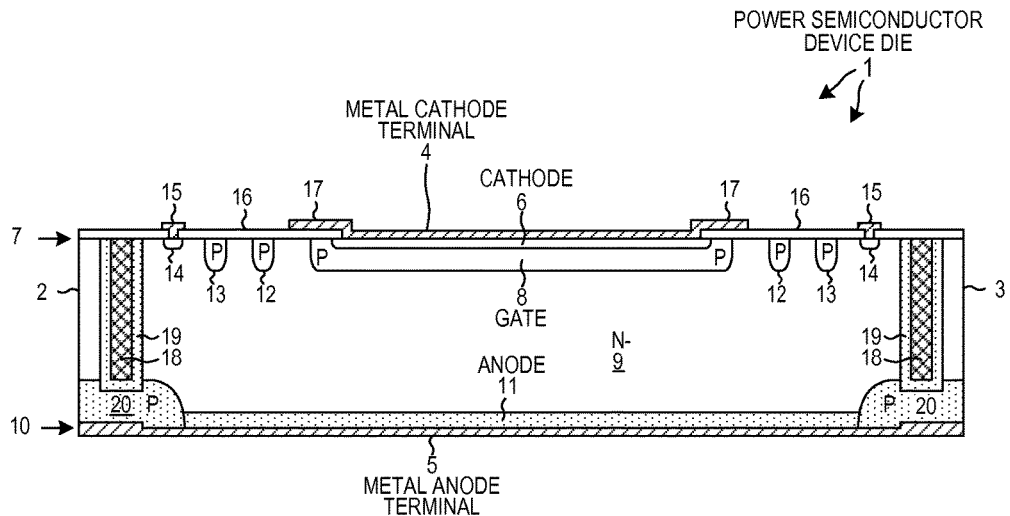
FIG. 1 is a cross-sectional side view diagram of a power semiconductor device die 1 in accordance with one novel aspect.

FIG. 1 is a cross-sectional side view diagram of a power semiconductor device die 1 in accordance with one novel aspect. The die 1 has a rectangular top surface, a rectangular bottom surface, and four peripheral side edges. Two of the side edges 2 and 3 are illustrated in the cross-sectional diagram. A high reverse blocking voltage thyristor that can withstand a very high 8500 volt blocking voltage in both the forward direction and in the reverse direction is realized in the active area of the die. The thyristor is a three terminal device that has a metal cathode terminal 4, a metal gate terminal (not seen in the particular cross-section of the diagram), and a metal anode terminal 5. The metal cathode terminal 4 contacts an N+ type cathode region 6. The N+ type cathode region 6 extends downward from the top semiconductor surface 7 into a P type gate region 8. The P type gate region 8 in turn extends down into the bulk silicon material 9 of the die, which is of N− type silicon. Extending upward from the bottom semiconductor surface 10 into the N− type bulk semiconductor material 9 is a P type anode region 11. The bottom semiconductor surface 10 is not entirely planar but rather has a very shallow peripheral groove 27. The shallow peripheral groove of the bottom surface 10 extends along the periphery of the die. Backside metal of the metal anode terminal 5 contacts the P type anode region 11 as shown.

In addition to these thyristor regions and terminals, the power semiconductor device die 1 includes edge termination structures. The edge termination structures include two P type floating rings 12 and 13, and an N+ type channel stopper ring 14. An optional metal ring plate 15 makes electrical contact with the channel stopper diffusion 14 below. The P type floating rings 12 and 13 extend down into the die from the top semiconductor surface 7 the same distance as does the P type gate region 8. The N+ type channel stopper diffusion 14 extends down into the die from the top semiconductor surface 7 the same distance as does the N+ type cathode region 6. A layer of passivation 16 covers over the peripheral guard rings and edge termination structures as illustrated. A field plate portion 17 of the metal cathode terminal 4 extends up and over a part of the passivation layer 16 around the periphery of the thyristor gate region. When the die 1 is considered from the top-down perspective, the rings 12 and 13 and the channel stopper 14 are concentric rings that surround the metal cathode terminal 4.

Figure 2:
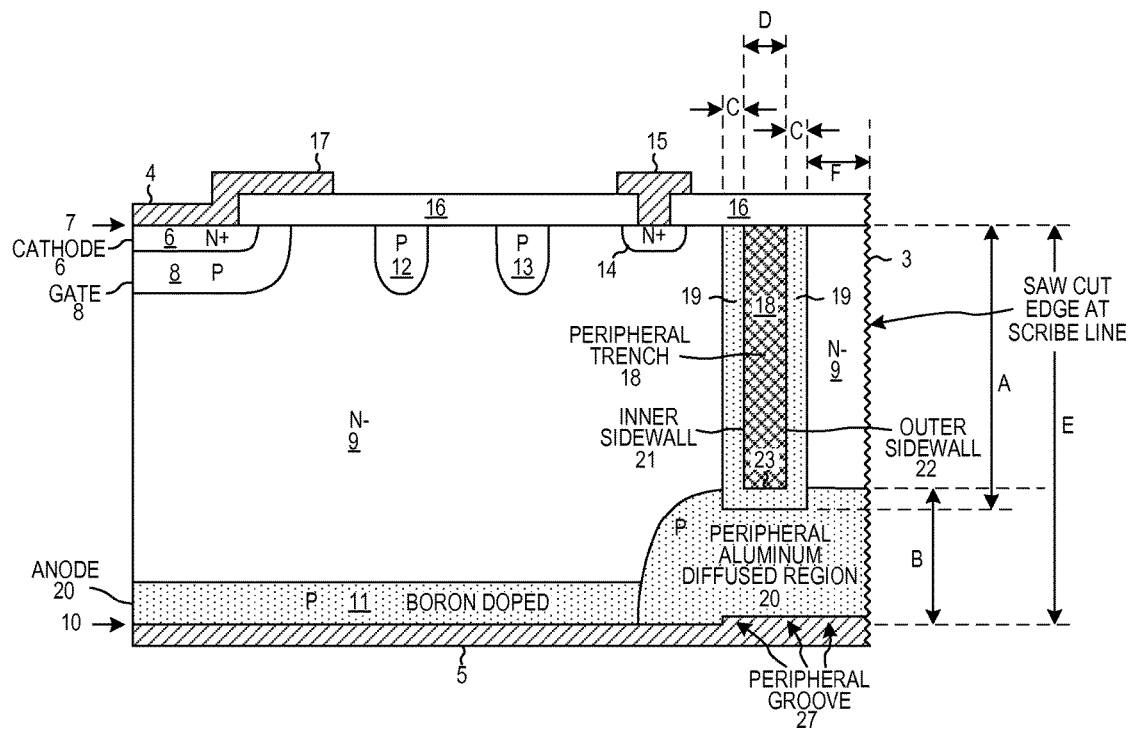
FIG. 2 shows an edge portion of the structure of FIG. 1 in more detail.

FIG. 2 shows an edge portion of the structure of FIG. 1 in more detail. A peripheral trench 18 extends downward into the die from the top semiconductor surface 7. The peripheral trench 18 has an inner sidewall 21, an outer sidewall 22, and a bottom 23. This peripheral trench 18 is "peripheral" in the sense that it extends along the rectangular periphery of the top surface of the rectangular die. The inner and outer sidewalls are vertical and extend downward substantially perpendicularly from the plane of the top semiconductor surface 7. An amount of the N− type bulk semiconductor material 9 laterally rings the peripheral trench 18 such that N− type semiconductor material is disposed between the peripheral trench and the peripheral side edges of the die. As shown in FIG. 1 and FIG. 2, a P type sidewall doped region 19 extends laterally inwardly from the inner sidewalls of the trench and also extends laterally outwardly from the outer sidewalls of the trench. A material fills the peripheral trench. This material may, for example, be silicon oxide or P type polysilicon or another suitable material that can fill a deep trench. Known techniques for filling trenches in trench IGBTs are employed.

A peripheral aluminum diffused region 20 of P type silicon is disposed under the peripheral trench 18. The peripheral aluminum diffused region 20 extends upward from the bottom semiconductor surface 10 toward the bottom of the peripheral trench, and also extends laterally outwardly to the peripheral side edges of the die. The dopant of the peripheral aluminum diffused region 20 is aluminum. In the illustration of FIG. 2, the peripheral aluminum diffused region 20 extends laterally to the right to die side edge 3. P type material of the peripheral aluminum diffused region 20 contacts and joins with P type material of the anode region 11 as shown. P type material of the peripheral aluminum region 20 also contacts and joins with P type material of the sidewall doped region 19 as shown. The crystal structure of the silicon at the side edges of the die is generally damaged at the time when the die is singulated from other dice when the source wafer is cut into dice. This is represented in FIG. 2 by the jagged edge labeled "saw cut edge at scribe line".

In one novel aspect, the thyristor device in the active area has extremely high forward and reverse blocking voltage ratings of 8500 volts, and yet its peripheral separation diffusion structure is manufactured in an economically realistic amount of time of less than 200 hours. In order to be able to provide the very high reverse blocking withstand voltage rating of 8500 volts, the die thickness E between the bottom semiconductor surface 10 and the top semiconductor surface 7 is greater than 600 microns. In the example of FIG. 1 and FIG. 2, distance E is 850 microns. The peripheral aluminum diffused region 20 extends upward from the bottom semiconductor surface 10 a distance B of at least 100 microns. Distance B is at least 100 microns, but it is less than half of the distance E. In the example of FIG. 1 and FIG. 2, distance B is about 300 microns. The diffusion time required to diffuse the aluminum dopant up from semiconductor surface 10 into the die this distance B is less than 200 hours, and in the example of FIG. 1 and FIG. 2 is about 150 hours. The peripheral trench 18 extends downward into the die from the top semiconductor surface 7 a distance A such that the P type material of the sidewall doped region 19 joins the P type material of the peripheral aluminum doped region 11. In the example of FIG. 1 and FIG. 2, the distance A is more than half of the overall die thickness E and is about 600 microns. A substantial amount of diffusion time is required to form the sidewall doped region 19 to an adequate thickness as required for the 8500 volt reverse breakdown voltage device. The thickness C of the sidewall doped region 19 is at least 20 microns, and in the example of FIG. 1 and FIG. 2 the thickness C of the sidewall doped region 19 is 50 microns. The diffusion time to form sidewall doped region 19 is about 80 hours. The width D of the peripheral trench 18 is about 100 microns. There is a distance F between the laterally outward limit of the sidewall doped region 19 and the die side edge 3. In the example of FIG. 1 and FIG. 2, distance F is about 100 microns.

Although in the illustrated example of FIG. 1 and FIG. 2 the device in the active area is a thyristor, the device in the active area in other examples is another type of device. For example, the device in the active in one example is a reverse blocking IGBT, and in another example is an inverse diode.

Figure 3:
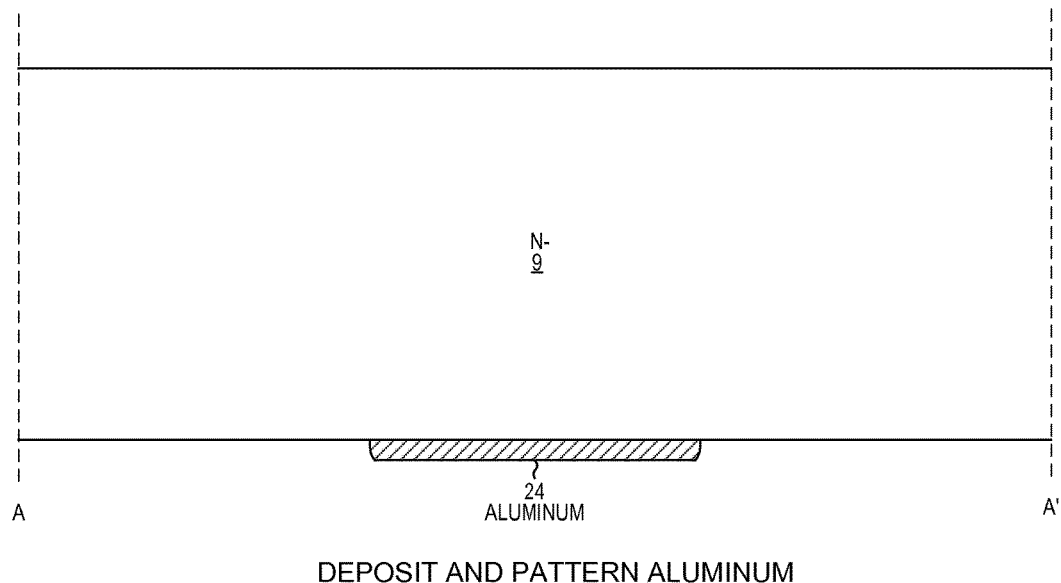
FIG. 3 shows a step, in a method of manufacturing the power semiconductor device die of FIG. 1, of depositing and patterning aluminum.
Figure 3A:
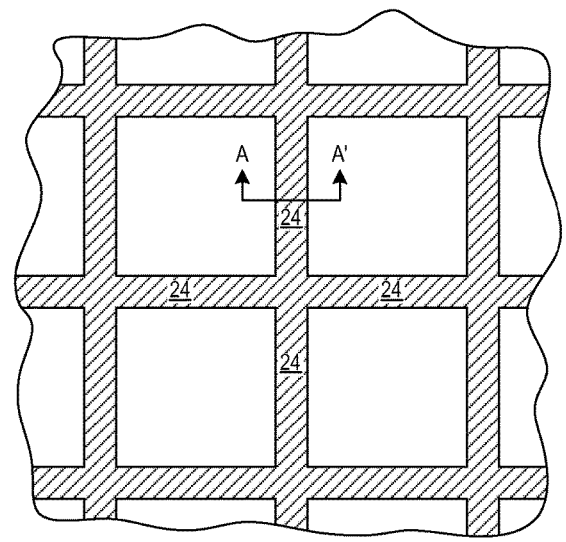
FIG. 3A is a view of the bottom surface of the wafer during the method of manufacturing the power semiconductor device die of FIG. 1, where the diagram shows the aluminum mesh-like grid that underlies the scribe areas at what will be the edges of the dice.

FIG. 3 through FIG. 13 set forth a method of making a semiconductor device die in accordance with one novel aspect. The initial starting wafer is of N-type bulk silicon 9. As shown in FIG. 3, aluminum 24 is deposited on the bottom side of the wafer, and is patterned so that aluminum is disposed under the scribe regions. FIG. 3 is a cross-sectional view taken at location of a scribe line. The aluminum 24 appears as a cross-section of a strip at this location. FIG. 3A is view of the bottom of the wafer. As FIG. 3A shows, the aluminum 24 forms a mesh-like grid structure that underlies all the scribe line areas. The cross-sectional diagram of FIG. 3 is taken along sectional line A-A' of FIG. 3A.

Figure 4:
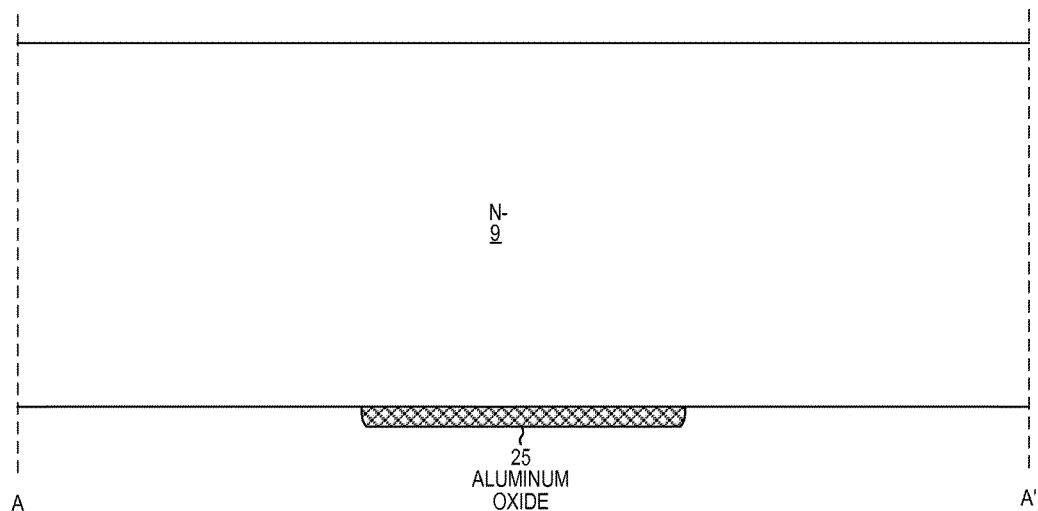
FIG. 4 shows a step, in the method of manufacturing the power semiconductor device die of FIG. 1, of converting aluminum into aluminum oxide.

Next, as shown in FIG. 4, the mesh-like grid of aluminum 24 is converted into aluminum oxide 25. In one example, the wafer is heated in a nitrogen-oxygen atmosphere, at a temperature of about 500 degrees Celsius, which is a temperature below the 660 degrees melting point of aluminum. As a result, the aluminum is oxidized without the aluminum first melting. Once oxidized, the resulting aluminum oxide 25 has a higher melting point in excess of two thousand degrees Celsius.

Figure 5:
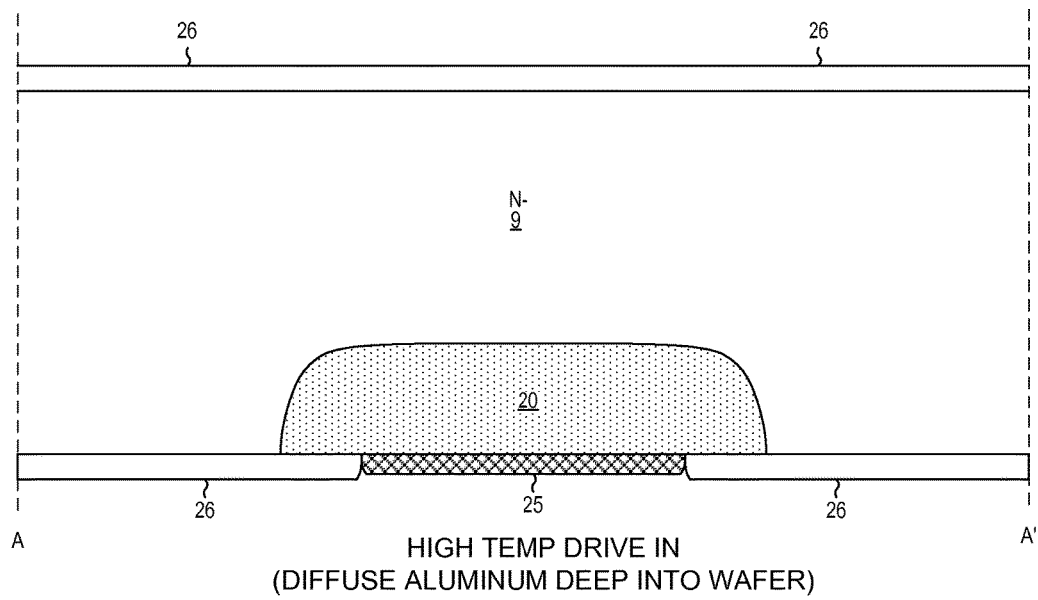
FIG. 5 shows a step, in the method of manufacturing the power semiconductor device die of FIG. 1, of diffusing aluminum into the wafer.

Next, as shown in FIG. 5, the temperature is then increased to about 1250 degrees Celsius. Under this high temperature condition, aluminum from the aluminum oxide 25 diffuses into the wafer. Silicon oxide 26 also grows on the exposed silicon surfaces on the top and bottom of the wafer. The high temperature condition is sustained long enough that the aluminum diffuses approximately 40 microns into the wafer, thereby forming peripheral aluminum diffused region 20. In one example, the diffusion time is about 70 hours. (Later in the process when boron regions are thermally diffused, this aluminum will diffuse an additional amount due to an additional 80 hours of diffusion time, for a total aluminum diffusion time of about 150 hours.)

Figure 6:
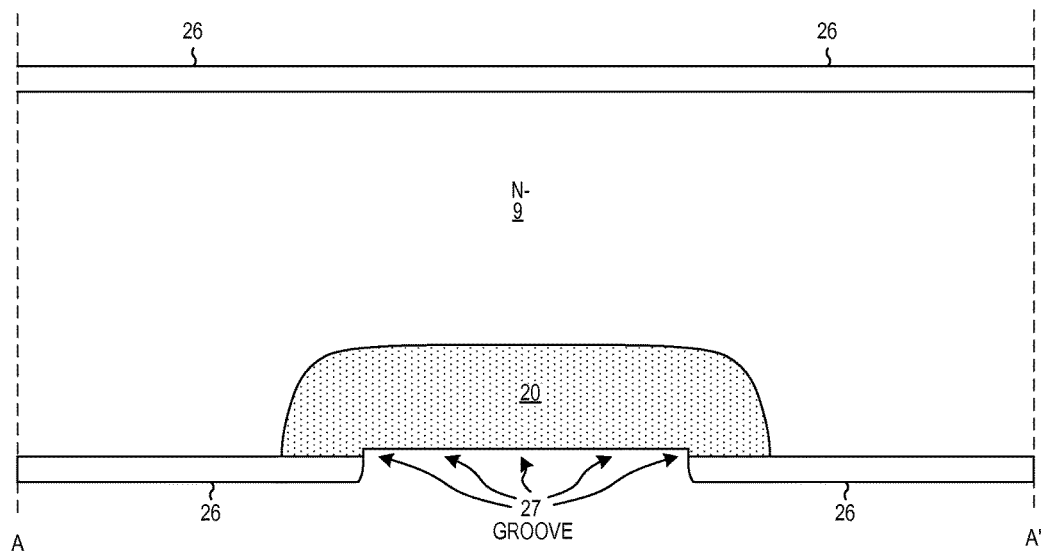
FIG. 6 shows a step, in the method of manufacturing the power semiconductor device die of FIG. 1, of removing the aluminum oxide.

Next, as shown in FIG. 6, the aluminum oxide 25 is chemically removed by underetching in a wet etch step using potassium hydroxide (KOH). A shallow groove 27 that is about 10 microns in depth remains where the aluminum oxide had been.

Figure 7:
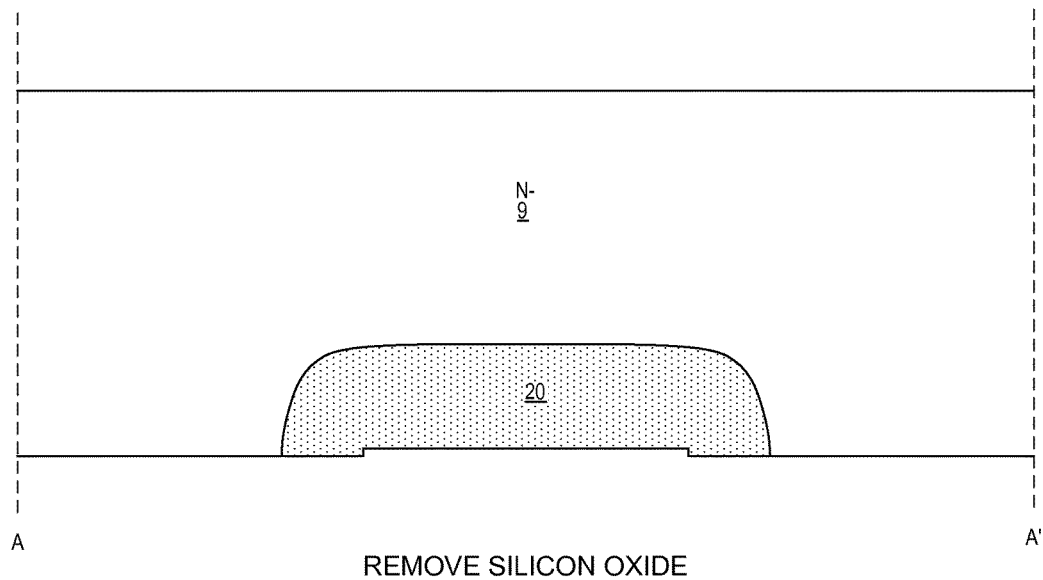
FIG. 7 shows a step, in the method of manufacturing the power semiconductor device die of FIG. 1, of removing silicon oxide from the wafer.

Next, as shown in FIG. 7, the silicon oxide layer 26 is removed in a wet etch cleaning step using hydrofluoric acid (HF). Alternatively, or in addition, chemical mechanical polishing is employed. The cleaning process removes all silicon oxide but may also remove an amount of semiconductor material (for example, it may remove one micron of silicon) from the bottom surface of the wafer.

Figure 8:
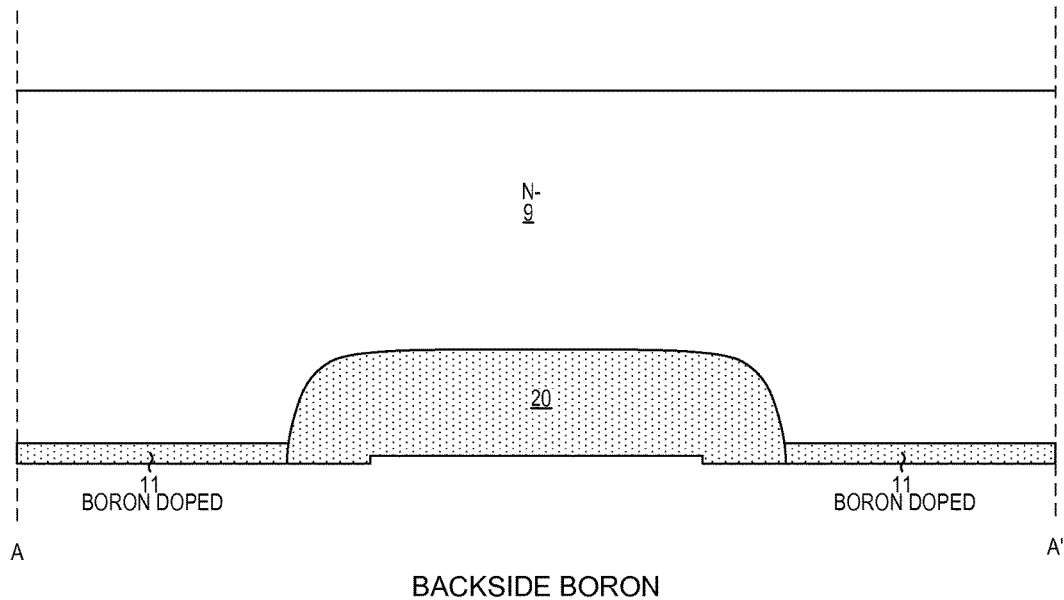
FIG. 8 shows a step, in the method of manufacturing the power semiconductor device die of FIG. 1, of diffusing boron into the bottom surface of the wafer.

Next, as shown in FIG. 8, boron is implanted and diffused into the bottom semiconductor surface and into the top semiconductor surface. At this point, P type anode region 11, front side P type region 8 and floating P rings 12 and 13 are about 20 microns thick.

Figure 9:
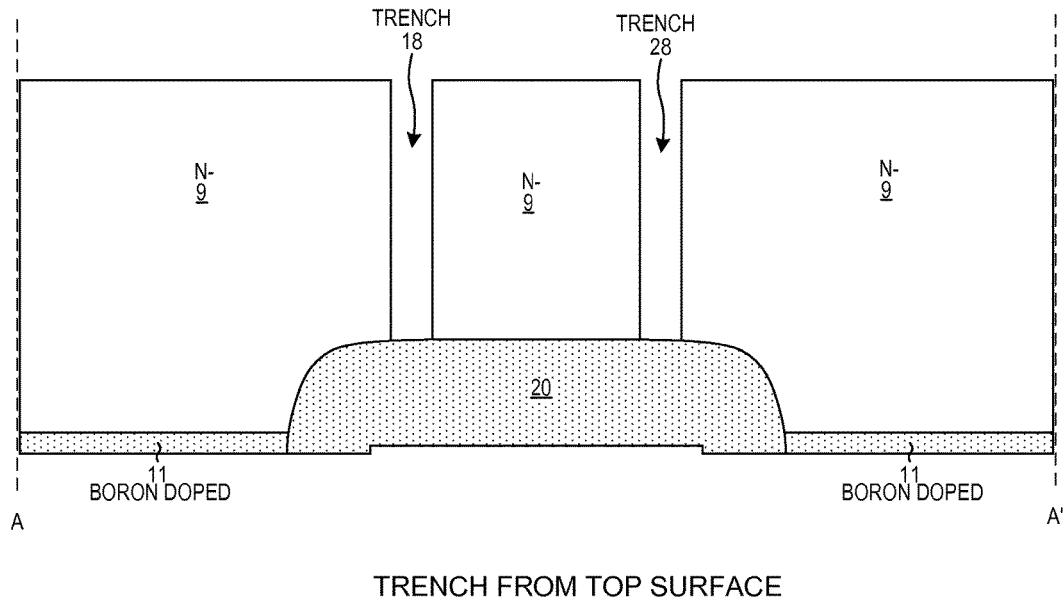
FIG. 9 shows a step, in the method of manufacturing the power semiconductor device die of FIG. 1, of formed trenches down into the wafer.
Figure 9A:
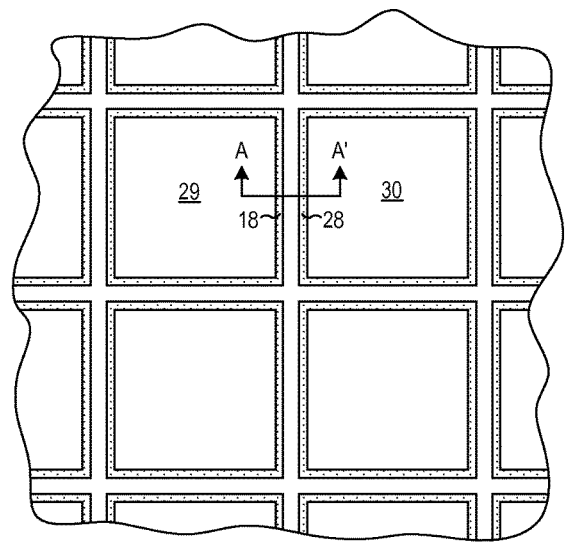
FIG. 9A is a view of the top surface of the wafer during the method of manufacturing the power semiconductor device die of FIG. 1, where the diagram shows trenches surrounding active areas.

Next, as shown in FIG. 9, vertical trenches 18 and 28 are formed down into the top semiconductor surface of the wafer to a depth of 600 microns. Reactive ion etching may be used. These trenches have vertical sidewalls, and are 100 microns wide. There is one such trench that extends around the active area of what will be each semiconductor device die. The cross-sections of two trenches 18 and 28 are seen in FIG. 9 because the cross-section of FIG. 9 cuts across the scribe area between what will be two adjacent dice. FIG. 9A shows the top of the wafer at this stage in processing. The cross-sectional diagram of FIG. 9 is taken along sectional line A-A' of top-down diagram FIG. 9A. From the top-down perspective of FIG. 9A, each trench has a square shape. Trench 18 extends around active area 29. Trench 28 extends around active area 30.

Figure 10:
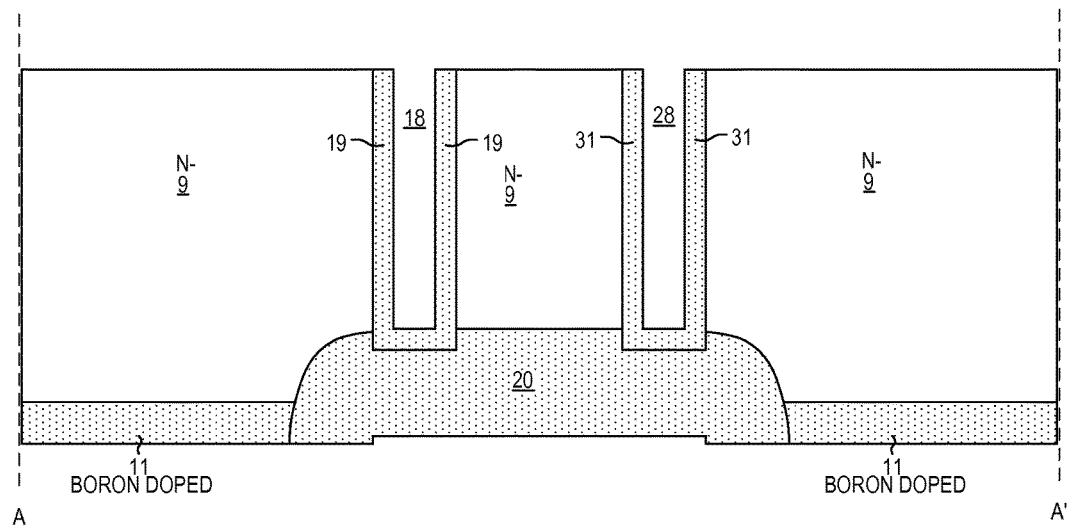
FIG. 10 shows a step, in the method of manufacturing the power semiconductor device die of FIG. 1, of diffusing boron into the trench sidewalls.

Next, as shown in FIG. 10, a sidewall doping step is performed to diffuse boron into the trench sidewalls, thereby forming sidewall doped regions 19 and 31. Vapor phase diffusion of diborane or another suitable doping technique is employed. During this step, most of the top surface of the wafer is masked off with a thick layer of silicon oxide or other material to block dopants (not shown) so that boron is not also diffused down everywhere into the upper surface of the wafer at the time when regions 19 and 31 are formed.

Next, the boron dopants of all boron doped regions are thermally diffused further for about 80 hours more of diffusion time. This thermal step causes boron of sidewall doped regions 19 and 31 to diffuse further so that the sidewall doped regions 19 and 31 have their final desired sidewall depths of 50 microns, and causes boron of the anode region 11 to diffuse further upward to its final desired extent of 40 microns, and causes boron of the gate region 8 to diffuse down further to its final junction depth of 40 microns, and causes boron of the floating rings 12 and 13 to diffuse down to their final depths of 40 microns, and causes aluminum of region 20 to diffuse further upward to its final desired extent of 300 microns.

Figure 11:
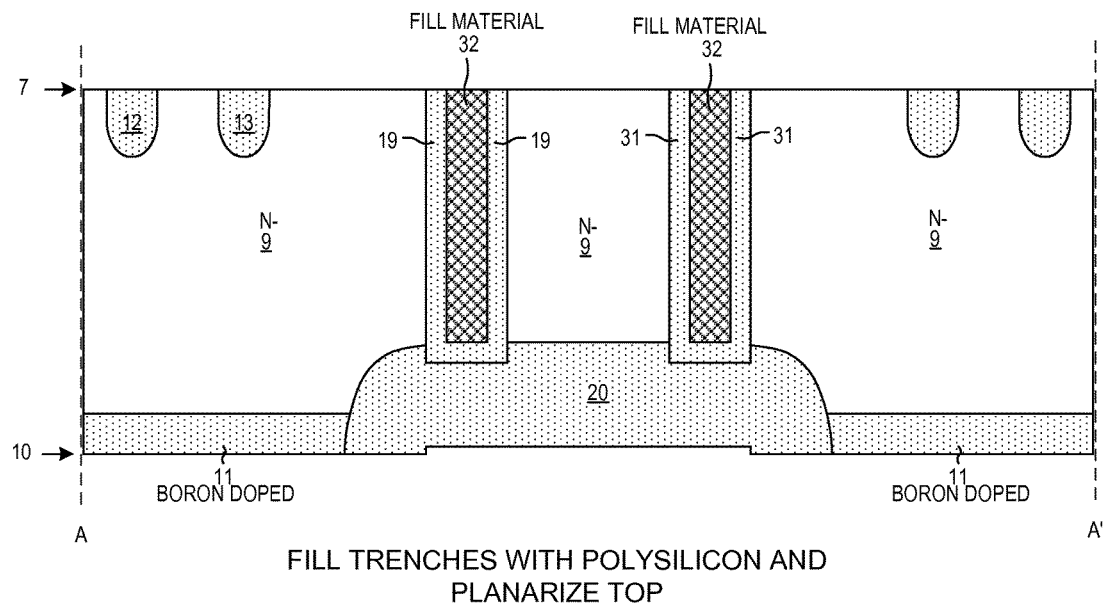
FIG. 11 shows a step, in the method of manufacturing the power semiconductor device die of FIG. 1, of filling the trenches and planarizing the top of the wafer.

Next, as shown in FIG. 11, the trenches are filled with a fill material 32, such as silicon oxide or P type polysilicon. After the deposition of the fill material, the upper semiconductor surface 7 of the wafer is planarized in a chemical mechanical polishing or mechanical grinding step.

Figure 12:
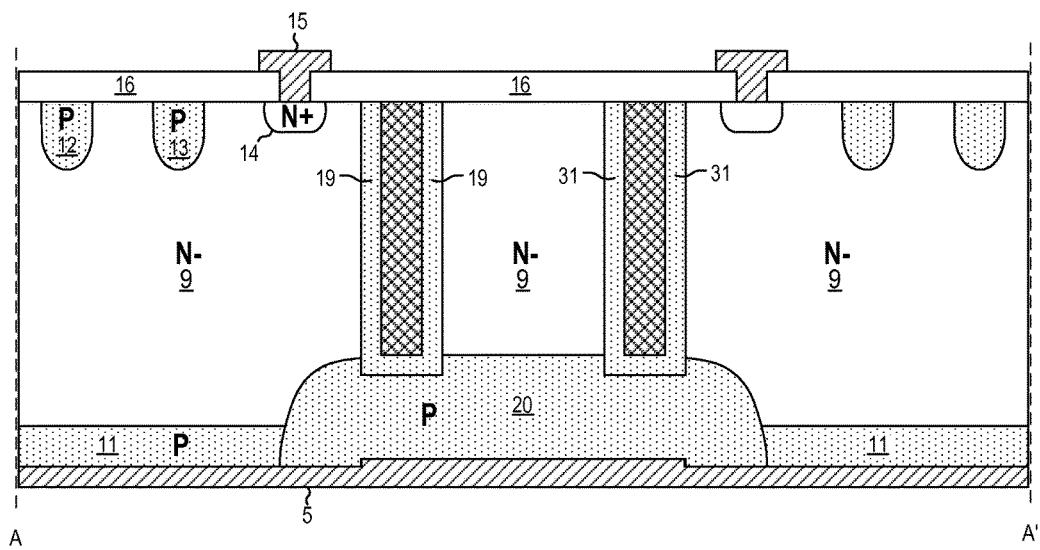
FIG. 12 shows the result of several more steps of the method of manufacturing the power semiconductor device die of FIG. 1, of forming topside structures on the wafer.

FIG. 12 is a simplified cross-sectional diagram of the resulting wafer structure, shown here with floating ring structures, channel stopper structures, and metallization structures.

Figure 13:
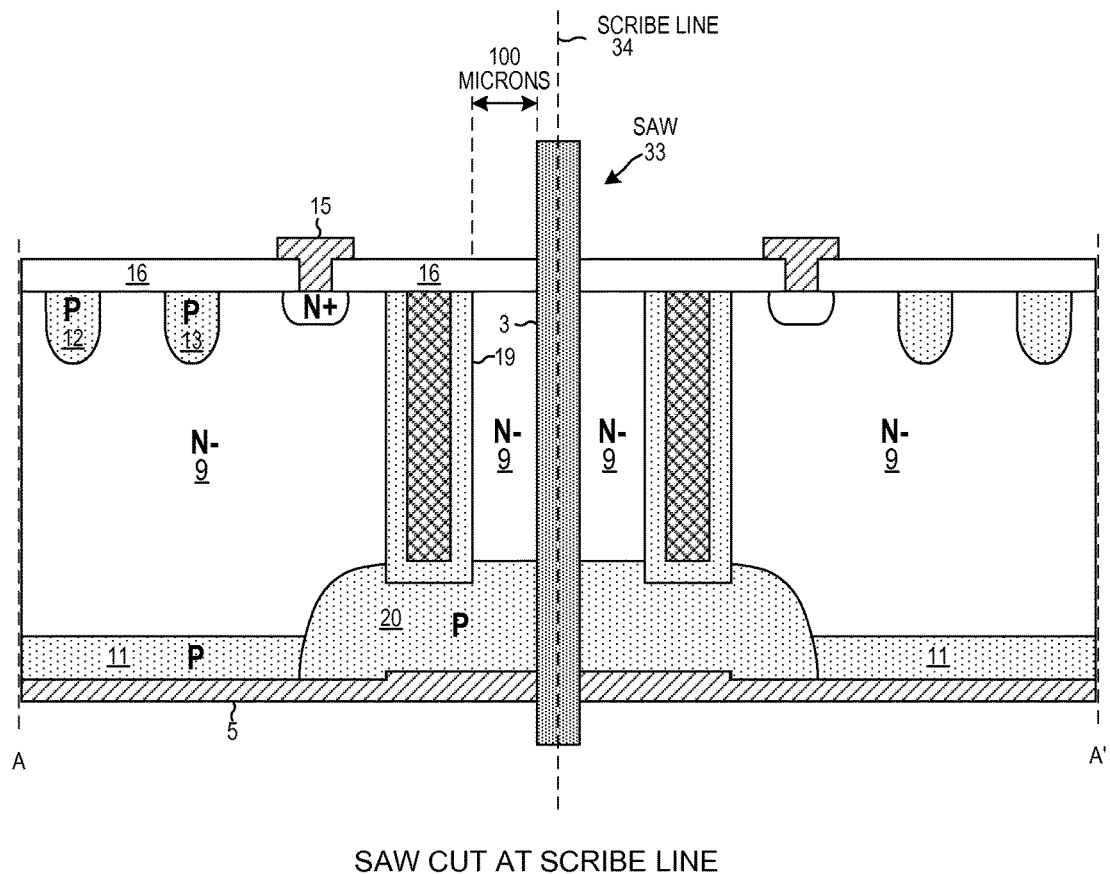
FIG. 13 shows a step, in the method of manufacturing the power semiconductor device die of FIG. 1, of singulating the power semiconductor device die of FIG. 1 from the wafer by cutting the wafer along scribe lines.

Next, as shown in FIG. 13, the wafer structure is then cut along the scribe lines into square semiconductor device dice. Advantageously, the top semiconductor surface of each die is square even though the devices have 8500 volt forward and reverse blocking voltages. Advantageously, the square die does not have termination edge bevels and the expense of providing such bevels is avoided. In the particular view of FIG. 13, the wafer is cut, such as using a mechanical saw 33 or using a laser, along the scribe line 34. The sawing may consume between 80 to 100 microns of silicon material. Prior to sawing, a malleable foil may be applied to the backside of the wafer in a hot roll process so that material of the foil is pressed into grooves in the bottom of the wafer to support the wafer material at the scribe line areas during sawing. Anode metal 5 may not be entirely planar at the bottom of the wafer, and the foil supports the wafer during sawing. An additional expensive step of planarizing the bottom semiconductor surface 10 of the wafer is thereby avoided, and the shallow peripheral groove 27 remains in each finished semiconductor device. Each of the resulting dice is as shown in the cross-sectional diagram of FIG. 1. The outward boundary of the sidewall doped region 19 is about 100 microns from the side edge of the die.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A power semiconductor device die having a top semiconductor surface, a bottom semiconductor surface, and peripheral side edges, the die comprising:
   a peripheral trench that extends downward into the die from the top semiconductor surface, wherein the peripheral trench has inner sidewalls, outer sidewalls, and a bottom, wherein an amount of N type semiconductor material laterally rings the trench such that N type semiconductor material is disposed between the peripheral trench and the peripheral side edges of the die;
   a sidewall doped region that extends laterally inwardly from the inner sidewalls of the trench and that also extends laterally outwardly from the outer sidewalls of the trench, wherein the sidewall doped region is of P type semiconductor material;
   a material that fills the trench; and
   a peripheral aluminum diffused region that extends upward from the bottom semiconductor surface of the die toward the bottom of the trench and that also extends laterally outwardly to the peripheral side edges of the die, wherein the peripheral aluminum diffused region is of P type semiconductor material and is doped with aluminum, and wherein the P type semiconductor material of the peripheral aluminum diffused region extends upward and joins to P type semiconductor material of the sidewall doped region.

2. The power semiconductor device die of claim 1, wherein the top semiconductor surface is a substantially planar rectangular surface of semiconductor material.

3. The power semiconductor device die of claim 1, wherein the inner and outer sidewalls of the trench extend downward substantially perpendicularly from a plane of the top semiconductor surface.

4. The power semiconductor device die of claim 1, wherein the amount of N type semiconductor material that laterally rings the trench is an amount of N− type bulk silicon wafer material, and wherein an amount of this N− type bulk silicon wafer material forms a part of the peripheral side edges of the die.

5. The power semiconductor device die of claim 1, wherein the peripheral trench extends downward into the die from the top semiconductor surface a distance A, wherein the peripheral aluminum diffused region extends upward from the bottom semiconductor surface a distance B, wherein A is greater than B, and wherein B is between 100 to 300 microns.

6. The power semiconductor device die of claim 1, wherein the sidewall doped region extends laterally inwardly from the inner sidewalls of the trench a distance C, wherein C is at least 20 microns.

7. The power semiconductor device die of claim 1, wherein the die is at least 800 microns thick.

8. The power semiconductor device die of claim 1, wherein the power semiconductor device die comprises a thyristor that has a forward blocking withstand voltage of at least 8000 volts and also has a reverse blocking withstand voltage of at least 8000 volts.

9. The power semiconductor device die of claim 1, wherein the power semiconductor device die comprises an Insulated Gate Bipolar Transistor (IGBT) that has a forward blocking withstand voltage of at least 8000 volts and also has a reverse blocking withstand voltage of at least 8000 volts.

10. The power semiconductor device die of claim 1, wherein the die is at least 600 microns thick, and wherein the power semiconductor device die comprises a thyristor that has a forward blocking withstand voltage of at least 4000 volts and also has a reverse blocking withstand voltage of at least 4000 volts.

11. The power semiconductor device die of claim 1, wherein the bottom semiconductor surface is not entirely planar but rather has a shallow peripheral groove.

12. A reverse blocking thyristor die having a top semiconductor surface, a bottom semiconductor surface, and peripheral side edges, the die comprising:
   a peripheral trench that extends downward into the die from the top semiconductor surface, wherein the peripheral trench has inner sidewalls, outer sidewalls, and a bottom, wherein an amount of N type semiconductor material laterally rings the trench such that N type semiconductor material is disposed between the peripheral trench and the peripheral side edges of the die;
   a sidewall doped region that extends laterally inwardly from the inner sidewalls of the trench and that also extends laterally outwardly from the outer sidewalls of the trench, wherein the sidewall doped region is of P type semiconductor material;
   a material that fills the trench;
   a peripheral aluminum diffused region that extends upward from the bottom semiconductor surface of the die toward the bottom of the trench, wherein the peripheral aluminum diffused region is of P type semiconductor material and is doped with aluminum, and wherein the P type semiconductor material of the peripheral aluminum diffused region extends upward and joins to P type semiconductor material of the sidewall doped region;
   a thyristor gate region of P type semiconductor material;
   a thyristor cathode region that extends down from the top semiconductor surface of the die into the thyristor gate region, wherein the thyristor cathode region is of N+ type semiconductor material; and
   a thyristor anode region that extends upward from the bottom semiconductor surface of the die, wherein the thyristor anode region is of P type semiconductor material, wherein the thyristor gate, cathode and anode regions are parts of a thyristor, and wherein the thyristor has a forward blocking withstand voltage of at least 4000 volts and also has a reverse blocking withstand voltage of at least 4000 volts.

13. The reverse blocking thyristor of claim 12, wherein the inner sidewalls of the peripheral trench are substantially vertical, wherein the outer sidewalls of the peripheral trench are substantially vertical, and wherein the peripheral aluminum diffused region extends laterally outwardly to the peripheral side edges of the die.

14. The reverse blocking thyristor of claim 12, wherein the peripheral aluminum diffused region does not extend laterally outwardly to the peripheral side edges of the die.

15. The reverse blocking thyristor of claim 12, wherein the bottom semiconductor surface is not entirely planar but rather has a shallow peripheral groove, wherein the shallow peripheral groove extends upwardly into the peripheral aluminum diffused region but does not extend upwardly into the P type semiconductor material of the thyristor anode region.

16. A method of manufacture comprising:
   forming a peripheral aluminum diffused region of P type semiconductor material that extends upward into a semiconductor wafer from a bottom semiconductor surface of the wafer, wherein the semiconductor wafer is a least six hundred microns thick and is of N type bulk semiconductor material;
   forming a peripheral trench down into the semiconductor wafer from a top semiconductor surface of the wafer, wherein the peripheral trench has vertical inner sidewalls, vertical outer sidewalls, and a bottom, and wherein the peripheral aluminum diffused region and the peripheral trench extend around an active area of the wafer;
   forming a sidewall doped region of P type semiconductor material that extends laterally inwardly from the vertical inner sidewalls toward the active area, wherein the sidewall doped region of P type semiconductor material joins the peripheral aluminum region of P type semiconductor material so that P type semiconductor material extends contiguously and vertically a distance of at least eight hundred microns from the top semiconductor surface of the wafer to the bottom semiconductor surface of the wafer;
   filling the peripheral trench with a solid trench fill material; and
   singulating the wafer thereby forming a semiconductor device die having outer edges, wherein the peripheral trench extends along a periphery of the semiconductor device die, wherein an amount of N type bulk semiconductor material is disposed between the peripheral trench and outer edges of the die, and wherein the peripheral aluminum diffused region extends upward from the bottom semiconductor surface a distance of at least one hundred microns into the semiconductor device die.

17. The method of claim 16, wherein the peripheral aluminum diffused extends laterally to the outer edges of the semiconductor device die.

18. The method of claim 16, further comprising:
applying a malleable foil to the bottom semiconductor surface of the wafer prior to the singulating of the wafer.

19. The method of claim 16, wherein the bottom semiconductor surface of the semiconductor device die is not entirely planar but rather has a shallow peripheral groove.

20. The method of claim 16, wherein the semiconductor device die comprises a semiconductor device, wherein the semiconductor device has a forward blocking withstand voltage of at least 8000 volts and also has a reverse blocking withstand voltage of at least 8000 volts.

\* \* \* \* \*